United States Patent
Hsu

(10) Patent No.: US 7,054,477 B2
(45) Date of Patent: May 30, 2006

(54) AUTOMATIC ACCURATE ALIGNMENT METHOD FOR A SEMICONDUCTOR WAFER CUTTING APPARATUS

(75) Inventor: Chiu-Tien Hsu, Taichung (TW)

(73) Assignee: Uni-Tek System, Inc., Taichung City (TW)

( * ) Notice: Subject to any disclaimer, the term of this patent is extended or adjusted under 35 U.S.C. 154(b) by 741 days.

(21) Appl. No.: 10/294,216

(22) Filed: Nov. 13, 2002

(65) Prior Publication Data

US 2004/0091141 A1 May 13, 2004

(51) Int. Cl.
*G06K 9/00* (2006.01)
(52) U.S. Cl. ........................ 382/151; 382/294; 348/87
(58) Field of Classification Search ................. 382/151
See application file for complete search history.

(56) References Cited

U.S. PATENT DOCUMENTS

| | | | | |
|---|---|---|---|---|
| 4,163,212 A | * | 7/1979 | Buerger et al. | 382/151 |
| 4,301,470 A | * | 11/1981 | Pagany | 348/95 |
| 4,328,553 A | * | 5/1982 | Fredriksen et al. | 356/139.04 |
| 4,757,550 A | | 7/1988 | Uga | 382/8 |
| 5,793,901 A | * | 8/1998 | Matsutake et al. | 382/294 |
| 5,867,590 A | * | 2/1999 | Eylon | 382/151 |
| 6,018,395 A | * | 1/2000 | Mori et al. | 356/401 |
| 6,421,456 B1 | * | 7/2002 | Son et al. | 382/145 |
| 6,917,699 B1 | * | 7/2005 | Sugawara | 382/151 |
| 2002/0114507 A1 | * | 8/2002 | Lynch et al. | 382/151 |

FOREIGN PATENT DOCUMENTS

JP              405149716 A  *  6/1993

* cited by examiner

*Primary Examiner*—Jingge Wu
*Assistant Examiner*—Jordan Kuhn
(74) *Attorney, Agent, or Firm*—Greenberg Traurig LLP; Pablo E. Tapia

(57) ABSTRACT

An automatic accurate alignment method for a wafer cutting apparatus includes: (a) placing a wafer on a platform, and moving the platform and a camera unit to initial positions; (b) matching the electrical output of the camera unit with a key pattern to find a plurality of adjacent working patterns, and recording center point coordinates of the working patterns; (c) calculating at least one distance value associated with the center point coordinates of a corresponding adjacent pair of the working patterns; (d) determining whether any one calculated distance value complies with a key pattern dimension; and (e) upon determination that there is one calculated distance value that complies with the key pattern dimension, rotating the platform so that an imaginary line interconnecting the center point coordinates that are associated with the determined distance value is disposed parallel to a predetermined wafer cutting direction.

9 Claims, 11 Drawing Sheets

US 7,054,477 B2

AUTOMATIC ACCURATE ALIGNMENT METHOD FOR A SEMICONDUCTOR WAFER CUTTING APPARATUS

BACKGROUND OF THE INVENTION

1. Field of the Invention

The invention relates to an alignment method for a semiconductor wafer cutting apparatus, more particularly to an automatic accurate alignment method to be implemented by a semiconductor wafer cutting apparatus for positioning a semiconductor wafer at a required position.

2. Description of the Related Art

In a conventional semiconductor wafer cutting apparatus, positioning of a semiconductor wafer at a required cutting position is manually controlled. The manual control operation involves repeated tuning adjustment for accurate alignment of the semiconductor wafer with a cutter unit, and is thus inconvenient and time-consuming.

To overcome the aforesaid drawback, an automatic accurate alignment system has been proposed heretofore in U.S. Pat. No. 4,757,550. In the proposed system, two cameras with different magnifications are used to capture images of a semiconductor wafer that is to be automatically aligned. Although the proposed system can indeed shorten the alignment time period, the necessity of installing two cameras increases the cost of implementing the proposed system.

SUMMARY OF THE INVENTION

Therefore, the object of the present invention is to provide an automatic accurate alignment method to be implemented by a semiconductor wafer cutting apparatus for positioning a semiconductor wafer at a required position and which requires the use of only a single camera to result in lower costs.

According to the present invention, an automatic accurate alignment method is to be implemented by a semiconductor wafer cutting apparatus for positioning a semiconductor wafer at a required position. The semiconductor wafer is formed with an array of polygonal circuit areas. Adjacent ones of the polygonal circuit areas are spaced apart by linear cutting streets. The semiconductor wafer cutting apparatus includes a platform, a camera unit, a cutter unit, and a processing unit. The platform is used to hold the semiconductor wafer, is movable along a first axis, and is rotatable about a second axis transverse to the first axis. The camera unit is disposed above the platform, is operable so as to generate an electrical output corresponding to at least a part of an image of the semiconductor wafer on the platform, and is movable along a third axis transverse to the first and second axes. The cutter unit is movable with the camera unit along the third axis, and is further movable along the second axis. The processing unit is coupled electrically to the platform, the camera unit and the cutter unit. The processing unit receives the electrical output of the camera unit, and controls movements of the platform, the camera unit and the cutter unit. The processing unit is configured with a key pattern database that contains a key pattern of a key polygonal circuit area having at least a first dimension along a first cutting direction, and a second dimension along a second cutting direction.

The automatic accurate alignment method comprises the steps of:

(a) placing the semiconductor wafer on the platform, and enabling the processing unit to move the platform and the camera unit to initial positions;

(b) enabling the processing unit to match the electrical output of the camera unit with the key pattern to find a plurality of adjacent working patterns in the electrical output of the camera unit, and to record center point coordinates of the working patterns;

(c) enabling the processing unit to calculate at least one distance value associated with the center point coordinates of a corresponding adjacent pair of the working patterns;

(d) enabling the processing unit to determine whether any one distance value calculated in step (c) complies with one of the first and second dimensions of the key polygonal circuit area; and (e) upon determination that there is one distance value calculated in step (c) that complies with one of the first and second dimensions of the key polygonal circuit area, enabling the processing unit to rotate the platform about the second axis so that an imaginary line interconnecting the center point coordinates that are associated with said one distance value is disposed parallel to one of the first and second cutting directions.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
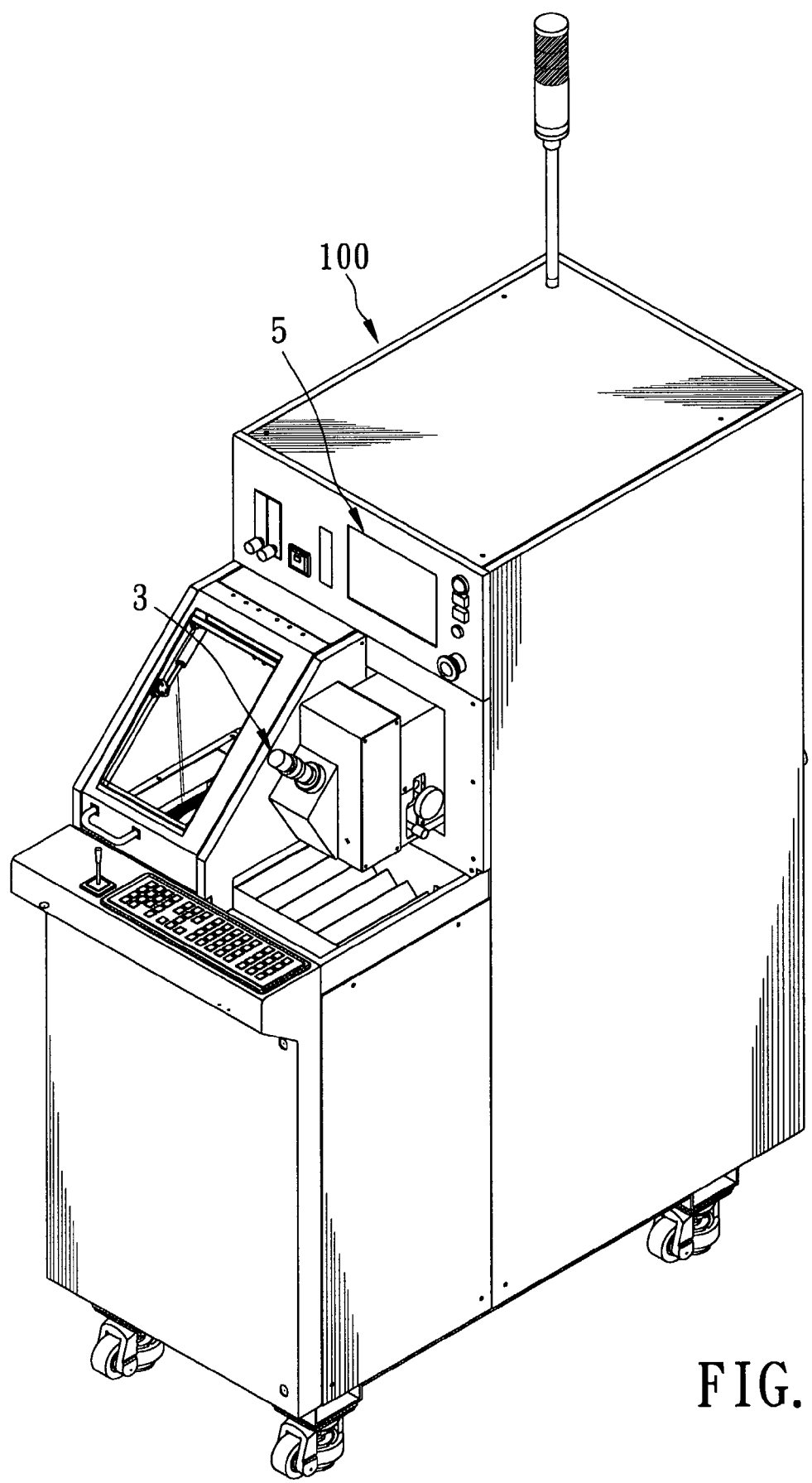
FIG. 1 is a perspective view of a semiconductor wafer cutting apparatus that implements a preferred embodiment of an automatic accurate alignment method according to the present invention.
Figure 2:
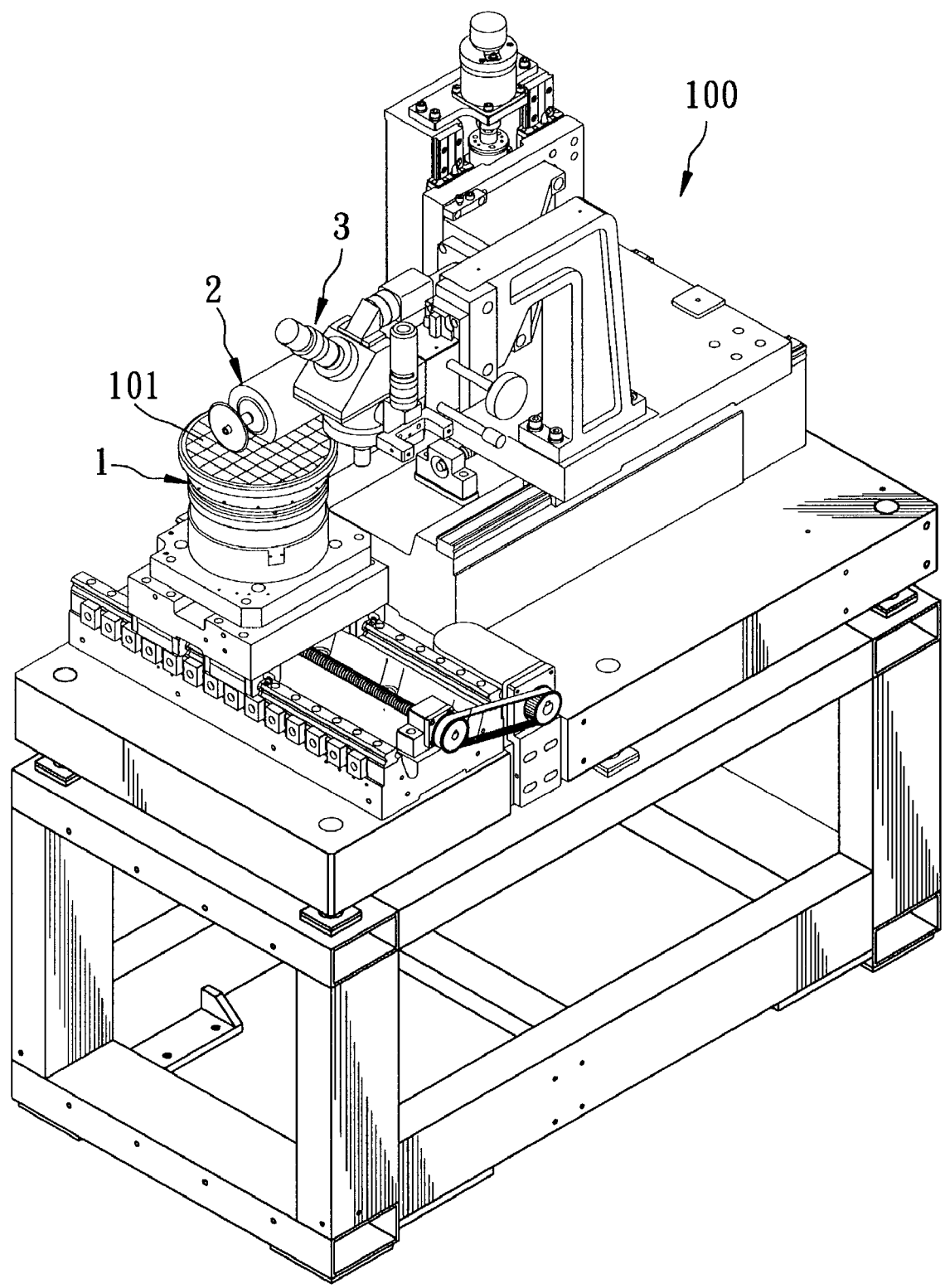
FIG. 2 is a perspective view illustrating the semiconductor wafer cutting apparatus of FIG. 1 with a housing removed therefrom.
Figure 3:
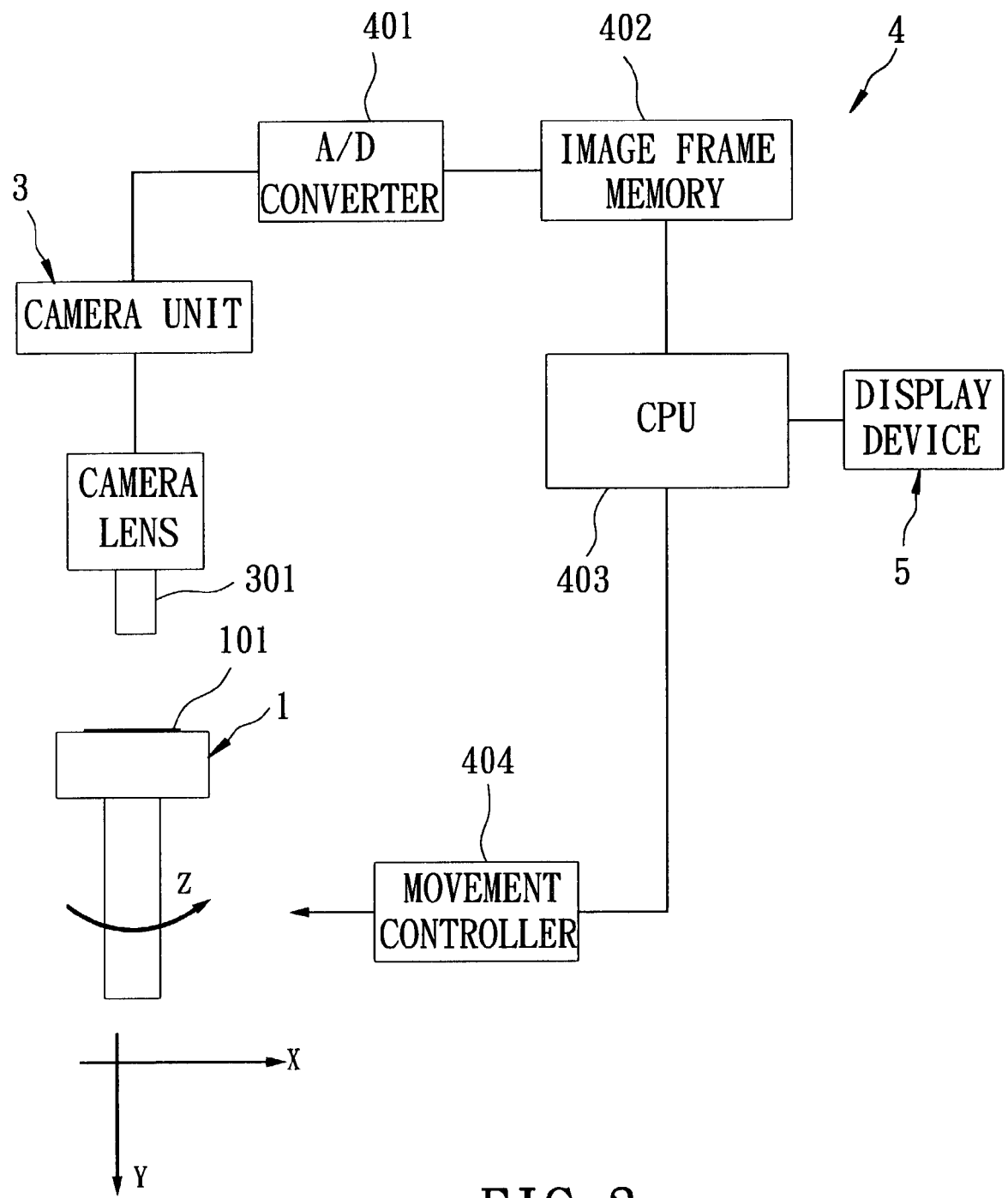
FIG. 3 is a schematic block diagram of the semiconductor wafer cutting apparatus of FIG. 1.

Referring to FIGS. 1, 2 and 3, the preferred embodiment of an automatic accurate alignment method according to the present invention is shown to be implemented by a known semiconductor wafer cutting apparatus 100 that includes a platform 1 adapted for holding a semiconductor wafer 101 having a patterned top surface (see FIG. 4), a cutter unit 2, a camera unit 3 with a camera lens 301, a processing unit 4, and a display device 5. The platform 1 is movable along a first axis (X), and is rotatable about a second axis (Z) transverse to the first axis (X). The camera unit 3 is disposed above the platform 1, and is operable so as to generate an electrical output corresponding to at least a part of an image of the semiconductor wafer 101 on the platform 1. The camera unit 3 is movable along a third axis (Y) transverse to the first and second axes (X, Z). The cutter unit 2 is movable with the camera unit 3 along the third axis (Y), and is further movable along the second axis (Z). The processing unit 4 is coupled electrically to the platform 1, the camera unit 3 and the cutter unit 2, receives the electrical output of the camera unit 3, and controls movements of the platform 1, the camera unit 3 and the cutter unit 2. In the exemplary semiconductor wafer cutting apparatus 100 of FIGS. 1 to 3, the processing unit 4 includes an analog-to-digital (A/D) converter 401 coupled electrically to the camera unit 3 for converting the electrical output of the camera unit 3 into image data, an image frame memory 402 coupled electrically to the A/D converter 401 for storing the image data from the A/D converter 401, a central processing unit (CPU) 403 coupled electrically to the image frame memory 402, and a movement controller 404 coupled electrically to the CPU 403, the platform 1, the camera unit 3 and the cutter unit 2. The display device 5 is coupled electrically to and is controlled by the CPU 403 to display an image corresponding to the image data stored in the image frame memory 402.

Figure 4:
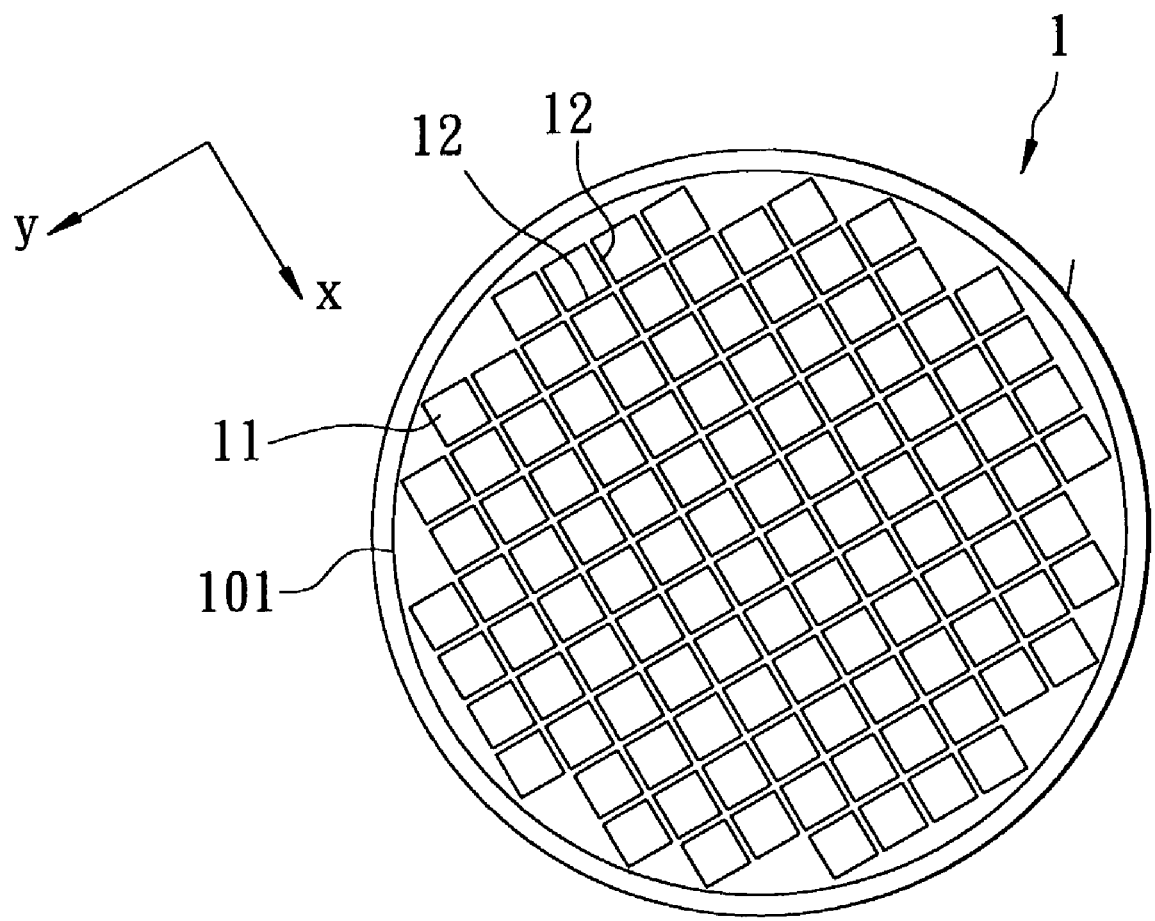
FIG. 4 is a top view showing a semiconductor wafer that is formed with an array of rectangular circuit areas.

As shown in FIG. 4, the semiconductor wafer 101 to be processed by the semiconductor wafer cutting apparatus 100 is formed with an array of rectangular circuit areas 11. Adjacent ones of the circuit areas 11 are spaced apart by linear cutting streets 12.

Figure 5:
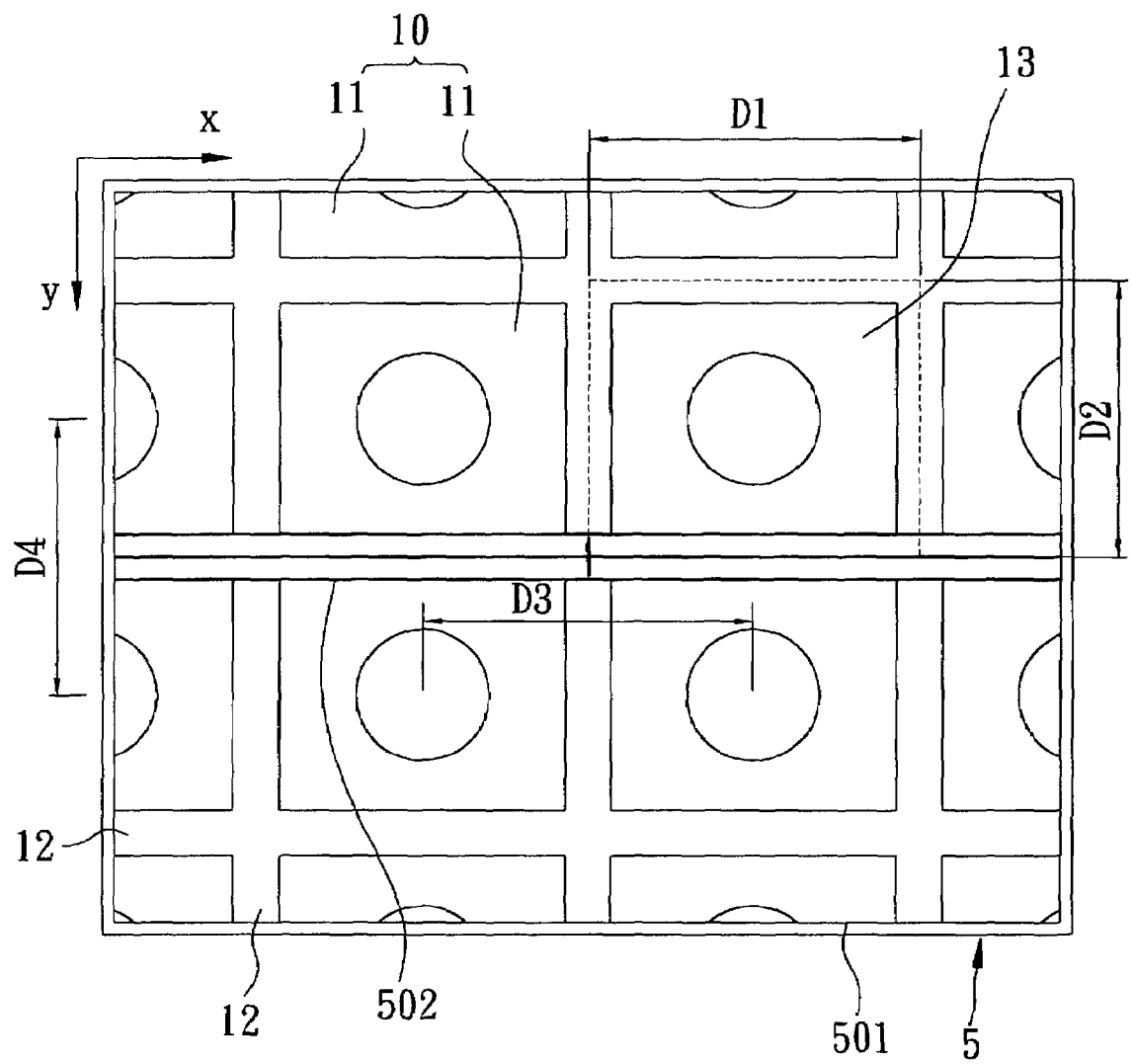
FIG. 5 illustrates an image displayed by a display device and corresponding to a portion of a key semiconductor wafer for establishing a key pattern according to the method of the preferred embodiment.

With further reference to FIG. 5 prior to automatic accurate alignment of the semiconductor wafer 101, a step of establishing a key pattern database in the processing unit 4 is executed. The step includes the sub-steps of:

placing a key semiconductor wafer 10 on the platform 2, the key semiconductor wafer 10 being formed with an array of identical key rectangular circuit areas 11 that are spaced apart by linear cutting streets 12;

activating the camera unit 3 to generate the electrical output corresponding to at least a part of an image of the key semiconductor wafer 10 on the platform 1;

enabling the processing unit 4 to control the display device 5 to display the image corresponding to the electrical output thereon;

performing a conventional manual alignment operation to control the processing unit 4 so as to adjust positions of the platform 1 and the camera unit 3 with reference to the image and linear markers 502 shown on a viewing window 501 of the display device 5 until the key semiconductor wafer 10 is disposed at the required position; and enabling the processing unit 4 to configure parameters of a key pattern 13 based on a selected one of the key rectangular circuit areas 11 of the key semiconductor wafer 10 once the key semiconductor wafer 10 has been disposed at the required position.

As shown in FIG. 5, each key rectangular circuit area 11 has a first dimension (D1) along a first cutting direction (x) and a second dimension (D2) along a second cutting direction (y). The first dimension (D1) is equal to the width of the circuit area 11 plus the width of the cutting street 12 along the first cutting direction (x), whereas the second dimension (D2) is equal to the width of the circuit area 11 plus the width of the cutting street 12 along the second cutting direction (y). Note that the first dimension (D1) is also equal to the distance (D3) between center point coordinates of an adjacent pair of the circuit areas 11 along the first cutting direction (x), whereas the second dimension (D2) is also equal to the distance (D4) between the center point coordinates of an adjacent pair of the circuit areas 11 along the second cutting direction (y).

Figure 6:
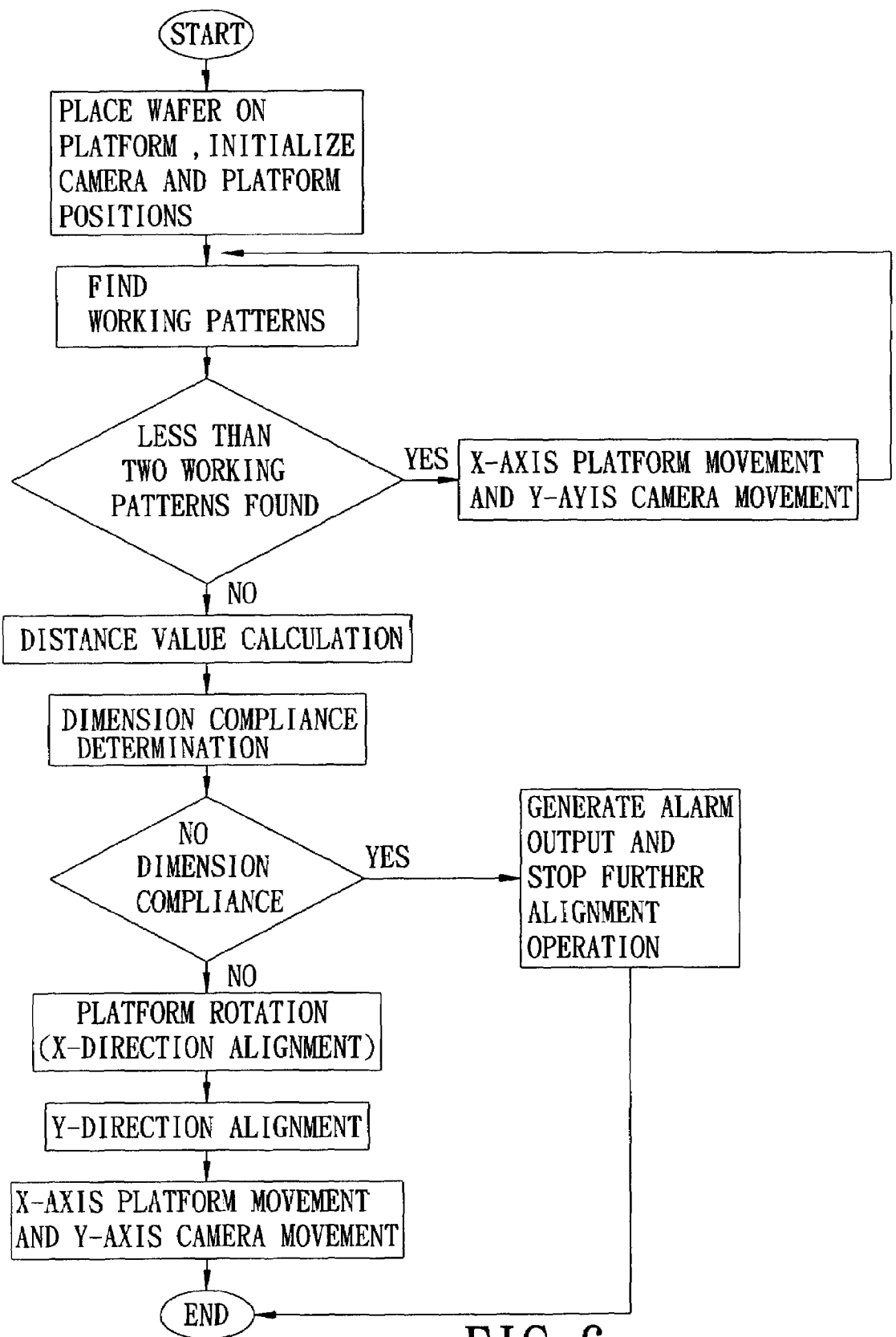
FIG. 6 is a flowchart illustrating consecutive steps of the preferred embodiment of the automatic accurate alignment method according to this invention.
Figure 7:
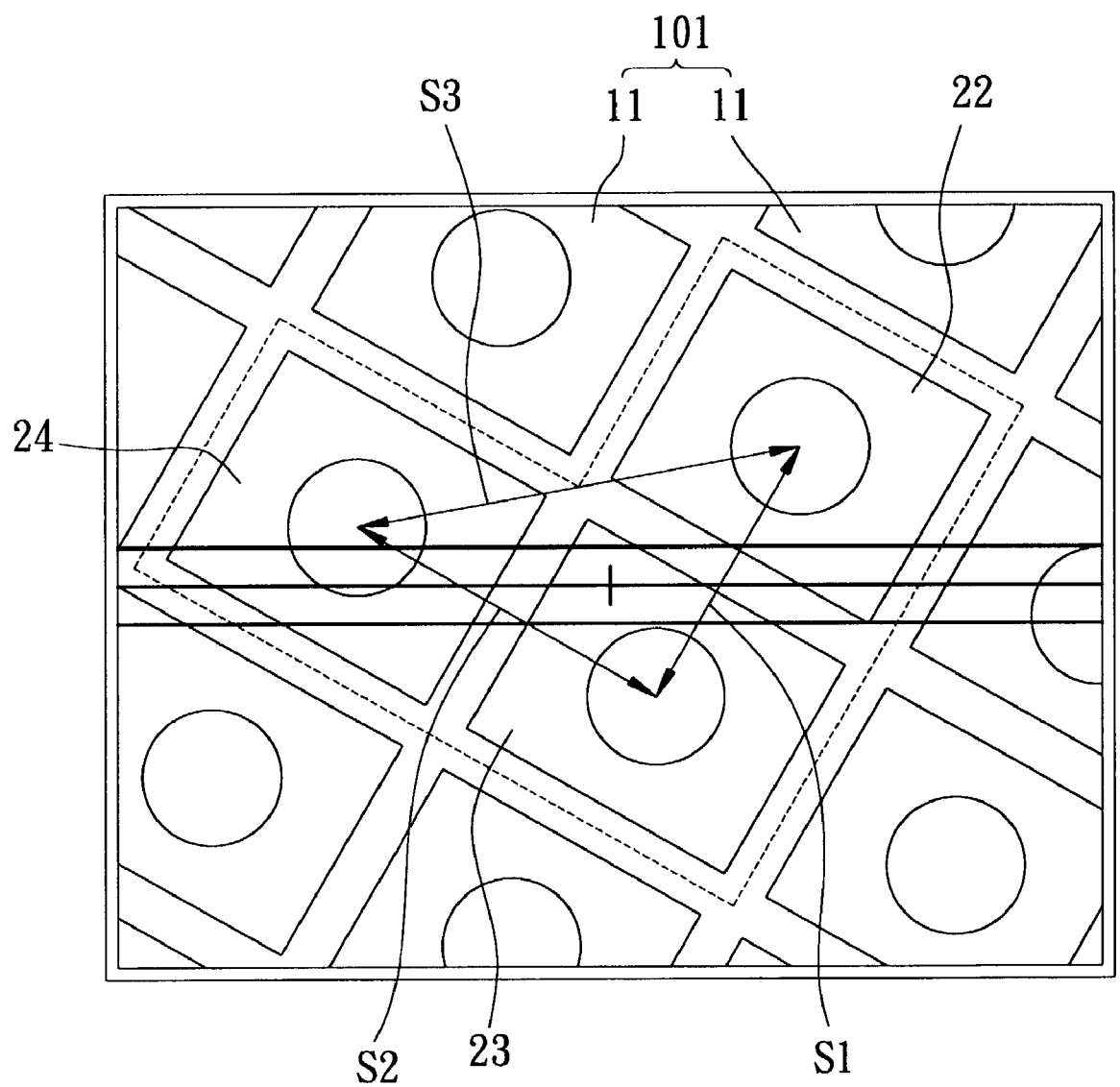
FIG. 7 shows an image displayed by the display device to illustrate how working patterns are found according to the method of the preferred embodiment.
Figure 8:
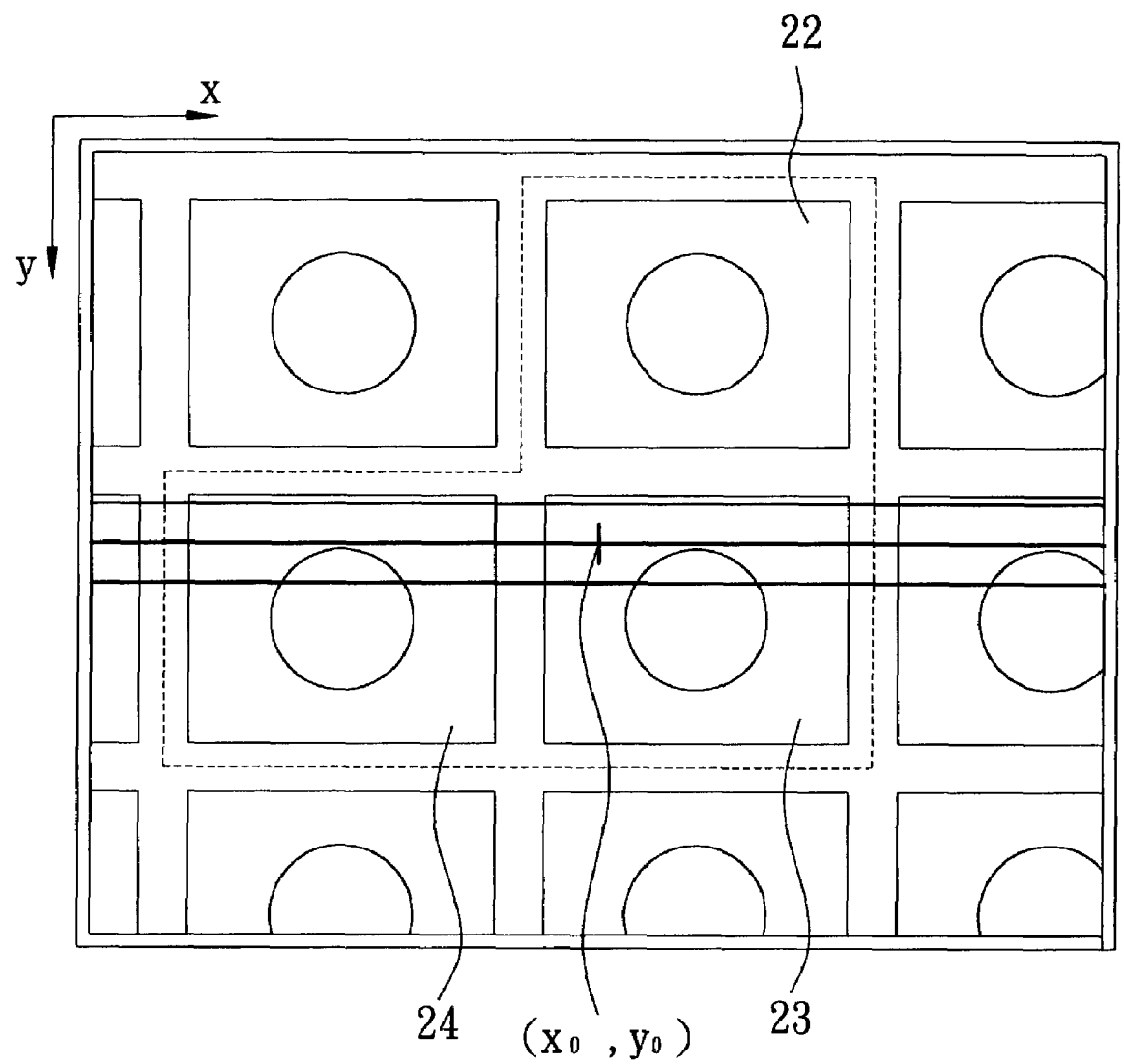
FIG. 8 shows an image displayed by the display device after aligning the semiconductor wafer in one cutting direction.
Figure 9:
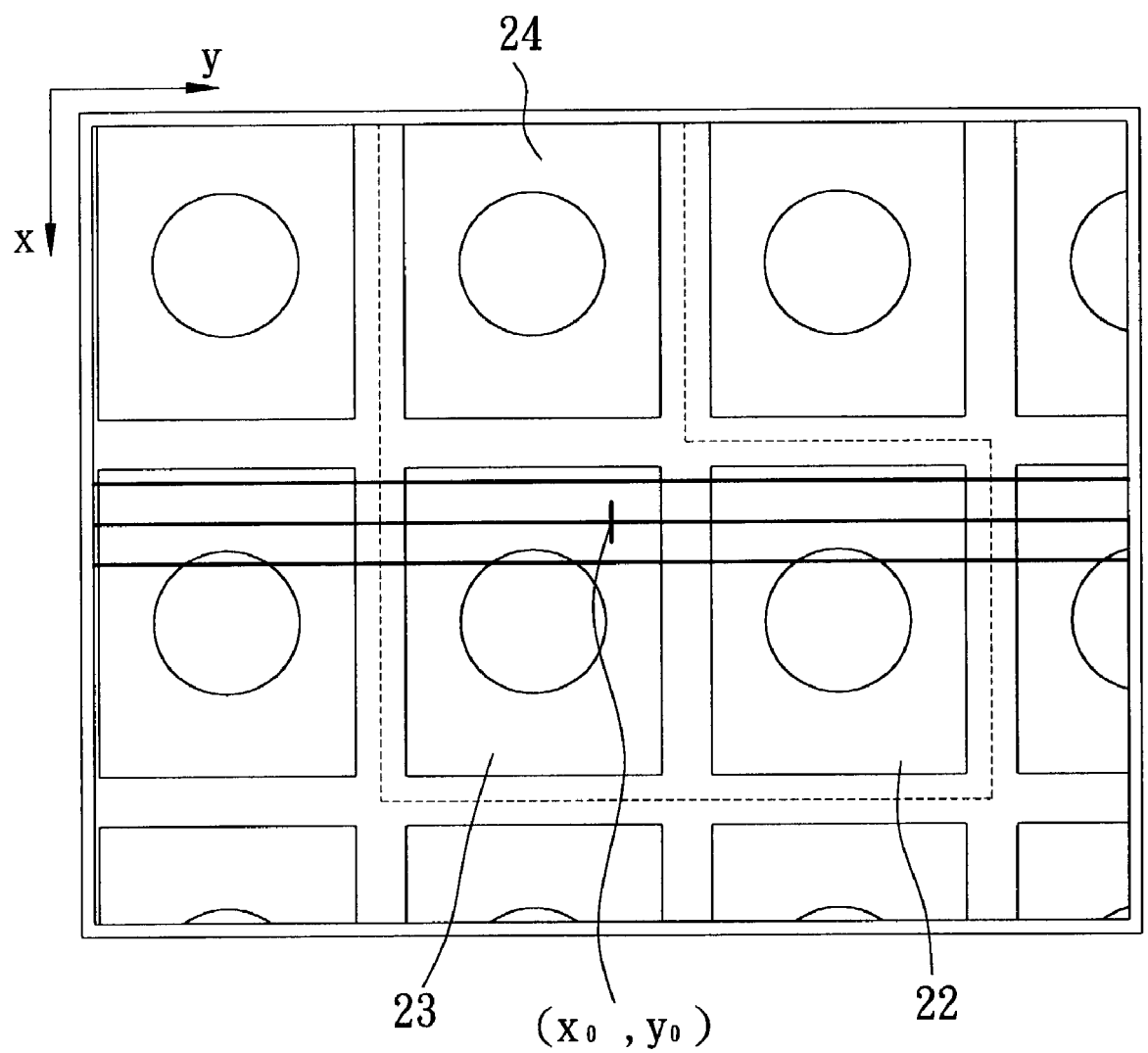
FIG. 9 shows an image displayed by the display device after 90-degree rotation of the semiconductor wafer from the position shown in FIG. 8.
Figure 10:
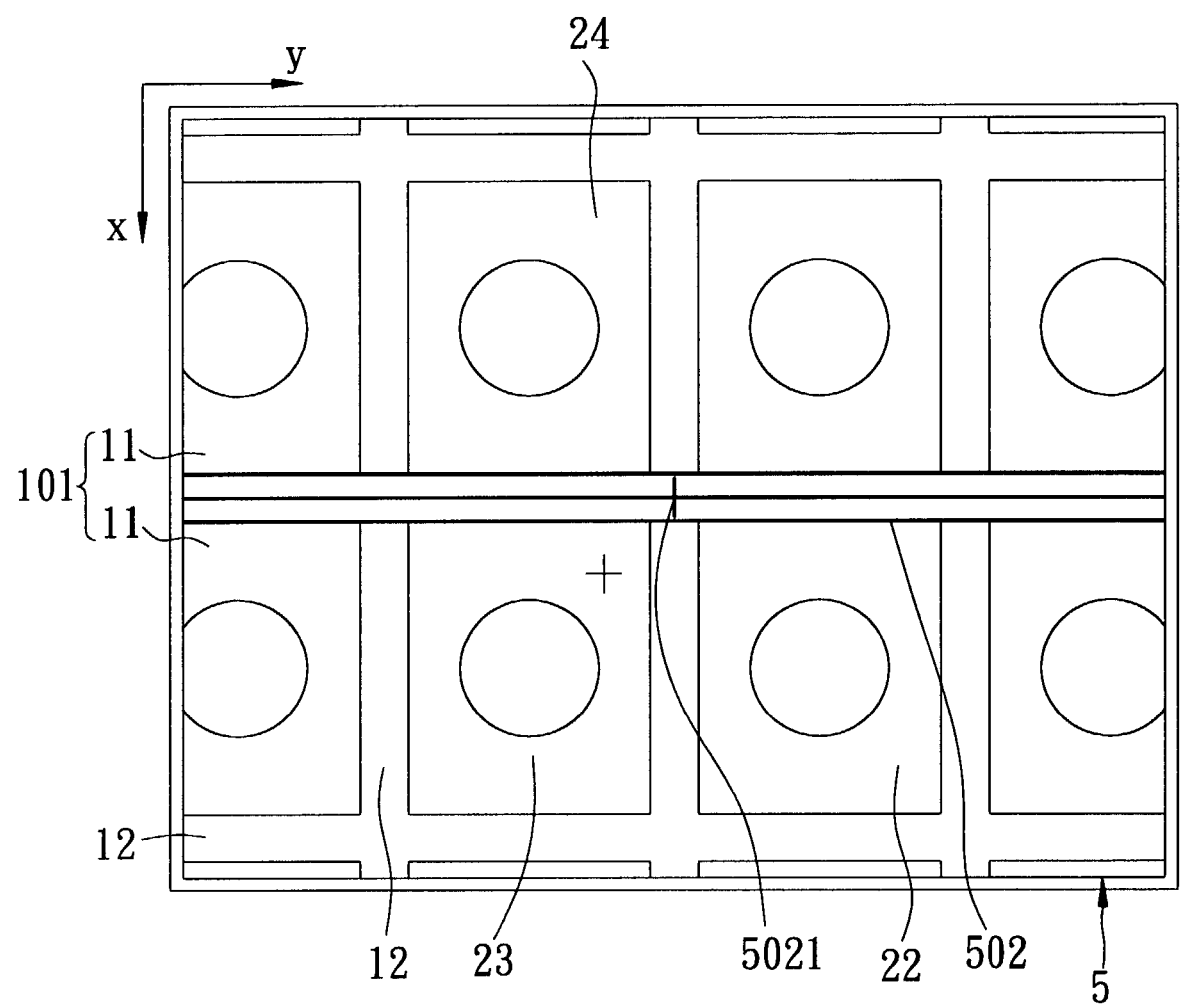
FIG. 10 shows an image displayed by the display device when the semiconductor wafer is positioned at a required position for cutting.

After configuring the processing unit 4 with the key pattern database, the semiconductor wafer cutting apparatus 100 can be used to position the semiconductor wafer 101 having specifications identical to those of the key semiconductor wafer 10 according to the method of the preferred embodiment. Referring to FIG. 6, the preferred embodiment of the automatic accurate alignment method according to this invention is shown to include the following steps:

(a) Placing the semiconductor wafer 101 on the platform 1, and enabling the processing unit 4 to move the platform 1 and the camera unit 3 to initial positions;

(b) Enabling the processing unit 4 to match the electrical output of the camera unit 3 with the key pattern 13 to find a plurality of adjacent working patterns in the electrical output of the camera unit 3 using known pattern matching techniques, and to record center point coordinates of the working patterns. Referring to FIG. 7, in this embodiment, three working patterns 22, 23, 24 are found in this step. In the event that less than two working patterns are found, such as when the image of a boundary portion of the semiconductor wafer 101 is captured by the camera unit 3, the processing unit 4 is enabled to drive movement of the platform 1 along the first axis (X) and movement of the camera unit 3 along the third axis (Y) so that a plurality of the working patterns 22, 23, 24 can be found from the electrical output of the camera unit 3;

(c) Enabling the processing unit 4 to calculate at least one distance value associated with the center point coordinates of a corresponding adjacent pair of the working patterns. In this embodiment, three distance values (S1, S2, S3) are calculated and are associated with the working pattern pairs 22 and 23, 23 and 24, 24 and 22, respectively, as best shown in FIG. 7;

(d) Enabling the processing unit 4 to determine whether any one distance value calculated in step (c) complies with one of the first and second dimensions (D1, D2) of the key rectangular circuit area 11. In this embodiment, an optimum fit is determined between each of the distance values (S1, S2, S3) and a preset one of the first and second dimensions (D1, D2). To determine the optimum fit, a difference value is calculated between each distance value (S1, S2, S3) and the preset dimension, i.e., the first dimension (D1). In the example of FIG. 7, the difference value for the distance value (S2) is found to be closest to zero, and the distance value (S2) is thus determined to comply with the first dimension (D1). Moreover, in the event that all of the calculated difference values exceed a default threshold value, an alarm output is generated to indicate that the specifications of the semiconductor wafer 101 differ from those of the key semiconductor wafer 10, and further alignment operation of the processing unit 4 is stopped;

(e) Upon determination that there is one distance value calculated in step (c) that complies with one of the first and second dimensions (D1, D2) of the key rectangular circuit area 11, enabling the processing unit 4 to rotate the platform 1 about the second axis (z) so that an imaginary line interconnecting the center point coordinates that are associated with said one distance value is disposed parallel to one of the first and second cutting directions (x, y). In this embodiment, as shown in FIG. 8, the processing unit 4 rotates the platform 1 about the second axis (Z) to rotate the wafer image shown on the display device 5 about a center point (x0, y0) so that an imaginary line interconnecting the center point coordinates that are associated with the distance value (S2) is disposed parallel to the first cutting direction (x);

(f) Enabling the processing unit 4 to rotate the platform 1 about the second axis (Z) by a 90-degree angle so that the imaginary line is disposed parallel to another of the cutting directions, i.e. the second cutting direction (y), as best shown in FIG. 9, and thereafter repeating step (b) to step (e), wherein dimension compliance in step (d) is determined with reference to the other of the first and second dimensions (D1, D2), i.e., the second dimension (D2) of the key rectangular circuit area 11; and (g) Enabling the processing unit 4 to drive movement of the platform 1 along the first axis (X), and to drive subsequent movement of the camera unit 3 along the third axis (Y) so that the semiconductor wafer 101 is disposed at a required cutting position. As shown in FIG. 10, when the semiconductor wafer 101 is disposed at the required position for cutting by the cutter unit 2 (see FIG. 2), a center point 5021 of the linear markers 502 shown on the display device 5 coincides with the crossing point of an intersecting pair of the cutting streets 12.

In the present invention, only key semiconductor wafers 10 are required to be manually aligned to establish the key pattern database. Thereafter, semiconductor wafers 101 having the same specifications as the key semiconductor wafer 10 can be automatically aligned by the semiconductor wafer cutting apparatus 100 that implements the automatic accurate alignment method of this invention. Therefore, this invention can facilitate accurate alignment of semiconductor wafers in an effective and less error-prone manner, and thus enables manufacturers to shorten the amount of time required to deliver products to customers. Moreover, it is not required to provide the semiconductor wafer cutting apparatus 100 with two cameras such that the cost of implementing the same can be kept low.

Figure 11:
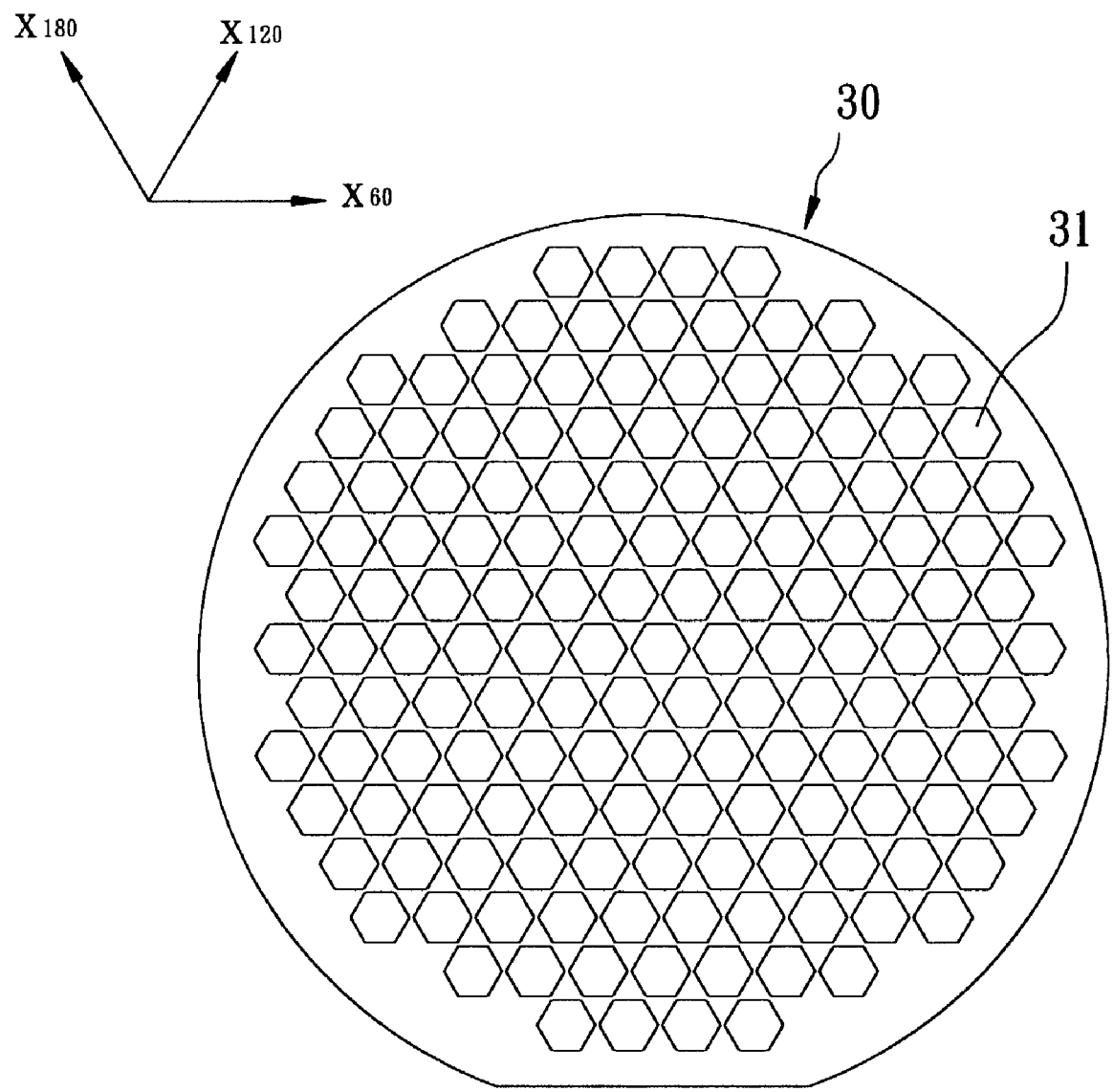
FIG. 11 illustrates a semiconductor wafer formed with hexagonal circuit areas and capable of being automatically and accurately aligned by a semiconductor wafer cutting apparatus that implements a modified preferred embodiment of the automatic accurate alignment method according to the present invention.

Furthermore, it should be noted that the method of this invention can be extended for positioning a semiconductor wafer 30 having hexagonal circuit areas 31, as best shown in FIG. 11. Each hexagonal circuit area 31 has three cutting directions $X_{60}$, $X_{120}$ and $X_{180}$. Unlike the method of the previous embodiment, after conducting automatic alignment in one of the cutting directions, e.g. $X_{60}$, further alignment in the other cutting directions, e.g. $X_{120}$ and $X_{180}$, is performed in the manner similar to that described above so as to position the semiconductor wafer 30 at the required position for cutting.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

I claim:

1. An automatic accurate alignment method to be implemented by a semiconductor wafer cutting apparatus for positioning a semiconductor wafer at a required position, the semiconductor wafer being formed with an array of polygonal circuit areas, adjacent ones of the polygonal circuit areas being spaced apart by linear cutting streets, the semiconductor wafer cutting apparatus including a platform for holding the semiconductor wafer, the platform being movable along a first axis and being rotatable about a second axis transverse to the first axis, a camera unit disposed above the platform and operable so as to generate an electrical output corresponding to at least a part of an image of the semiconductor wafer on the platform, the camera unit being movable along a third axis transverse to the first and second axes, a cutter unit movable with the camera unit along the third axis and further movable along the second axis, and a processing unit coupled electrically to the platform, the camera unit and the cutter unit, the processing unit receiving the electrical output of the camera unit and controlling movements of the platform, the camera unit and the cutter unit, the processing unit being configured with a key pattern database that contains a key pattern of a key polygonal circuit area having at least a first dimension along a first cutting direction and a second dimension along a second cutting direction, said automatic accurate alignment method comprising the steps of:

(a) placing the semiconductor wafer on the platform, and enabling the processing unit to move the platform and the camera unit to initial positions;

(b) enabling the processing unit to match the electrical output of the camera unit with the key pattern to find a plurality of adjacent working patterns in the electrical output of the camera unit, and to record center point coordinates of the working patterns;

(c) enabling the processing unit to calculate at least one distance value associated with the center point coordinates of a corresponding adjacent pair of the working patterns;

(d) enabling the processing unit to determine whether any one distance value calculated in step (c) complies with one of the first and second dimensions of the key polygonal circuit area; and (e) upon determination that there is one distance value calculated in step (c) that complies with one of the first and second dimensions of the key polygonal circuit area, enabling the processing unit to rotate the platform about the second axis so that an imaginary line interconnecting the center point coordinates that are associated with said one distance value is disposed parallel to one of the first and second cutting directions.

2. The automatic accurate alignment method as claimed in claim 1, wherein three working patterns are found in step (b), three distance values are calculated in step (c), and step (d) includes determining an optimum fit between each of the distance values calculated in step (c) and a preset one of the first and second dimensions of the key polygonal circuit area.

3. The automatic accurate alignment method as claimed in claim 2, wherein in step (e), the processing unit rotates the platform so that the imaginary line is disposed parallel to the cutting direction that is associated with the preset one of the first and second dimensions of the key polygonal circuit area.

4. The automatic accurate alignment method as claimed in claim 2, wherein the step of determining the optimum fit includes:

calculating a difference value between each of the distance values calculated in step (c) and the preset one of the first and second dimensions of the key polygonal circuit area, and generating an alarm output and stopping further alignment operation of the processing unit when all of the calculated difference values exceed a default threshold value.

5. The automatic accurate alignment method as claimed in claim 1, further comprising, after step (e):

(g) enabling the processing unit to drive movement of the platform along the first axis, and to drive subsequent movement of the camera unit along the third axis so that the semiconductor wafer is disposed at a required cutting position.

6. The automatic accurate alignment method as claimed in claim 5, further comprising, between steps (e) and (g):

(f) enabling the processing unit to rotate the platform about the second axis so that the imaginary line is disposed parallel to another of the cutting directions, and thereafter repeating step (b) to step (e), wherein dimension compliance in step (d) is determined with reference to the other of the first and second dimensions of the key polygonal circuit area.

7. The automatic accurate alignment method as claimed in claim 1, wherein step (b) includes:

if a plurality of the working patterns is not found, enabling the processing unit to drive movement of the platform along the first axis and movement of the camera unit along the third axis so that a plurality of the working patterns can be found from the electrical output of the camera unit.

8. The automatic accurate alignment method as claimed in claim 1, wherein step (d) includes:

calculating a difference value between each distance value calculated in step (c) and said one of the first and second dimensions of the key polygonal circuit area, and generating an alarm output and stopping further alignment operation of the processing unit when each calculated difference value exceeds a default threshold value.

9. The automatic accurate alignment method as claimed in claim 1, the semiconductor wafer cutting apparatus further including a display device coupled electrically to the processing unit, said automatic accurate alignment method further comprising, prior to step (a), the step of establishing the key pattern database that includes the sub-steps of:

placing a key semiconductor wafer on the platform, the key semiconductor wafer being formed with an array of identical key polygonal circuit areas;

activating the camera unit to generate the electrical output corresponding to at least a part of an image of the key semiconductor wafer on the platform;

enabling the processing unit to control the display device to display the image corresponding to the electrical output thereon;

performing a manual alignment operation to control the processing unit so as to adjust positions of the platform and the camera unit with reference to the image shown on the display device until the key semiconductor wafer is disposed at the required position; and enabling the processing unit to configure parameters of the key pattern based on a selected one of the key polygonal circuit areas of the key semiconductor wafer once the key semiconductor wafer has been disposed at the required position.

* * * * *